United States Patent [19]
Kakehashi

[11] Patent Number: 5,935,764
[45] Date of Patent: Aug. 10, 1999

[54] METHOD OF FORMING ALIGNMENT MARK AND FABRICATING SEMICONDUCTOR DEVICE

[75] Inventor: Eiichiro Kakehashi, Tokyo, Japan

[73] Assignee: NEC Corporation, Tokyo, Japan

[21] Appl. No.: 08/997,465

[22] Filed: Dec. 23, 1997

[30] Foreign Application Priority Data

Dec. 26, 1996 [JP] Japan .................................. 8-347678

[51] Int. Cl.$^6$ .......................... H01L 21/027; G03C 9/00
[52] U.S. Cl. ................. 430/314; 430/22; 430/30
[58] Field of Search ............................. 430/22, 30, 312, 430/314

[56] References Cited

U.S. PATENT DOCUMENTS 5,258,096  11/1993  Sandhu et al. ......................... 438/621

FOREIGN PATENT DOCUMENTS 3-003223  1/1991  Japan .
4-260328  9/1992  Japan .

Primary Examiner—John A. McPherson

[57] ABSTRACT

A formation method of an alignment mark is provided. After an etching resist part is formed on a first dielectric layer, a second dielectric layer is formed on the first dielectric layer to cover the etching resist part. Then, the second dielectric layer is selectively etched to form a recess uncovering the etching resists part using a first patterned lithography resist film as a mask. In this etching process, the first dielectric layer is prevented from being etched in the recess of the second dielectric layer by the etching resist part. A layer to be patterned is formed on the second dielectric layer and a second patterned lithography resist film is formed on the layer to be patterned. The second patterned lithography resist film has such a shape that a part of the second lithography resist film is left in the recess of the second dielectric layer. The part of the second lithography resist film in the recess has a height difference approximately equal to or less than the thickness of the second dielectric layer from another part of the second lithography resist film outside the recess. The alignment error of a pattern of the second lithography resist film with respect to a pattern of the second dielectric layer is measured correctly.

6 Claims, 7 Drawing Sheets

METHOD OF FORMING ALIGNMENT MARK AND FABRICATING SEMICONDUCTOR DEVICE

BACKGROUND OF THE INVENTION

1. Field of the Invention

The present invention relates to a semiconductor device fabrication and more particularly, to a formation method of an alignment mark used for detecting or measuring the pattern alignment in optical lithography, and a fabrication method of a semiconductor device using the formation method of the mark.

2. Description of the Prior Art

In recent years, the reduction projection exposure technique has been popularly used in photolithography processes for fabricating semiconductor devices with the progressing miniaturization of circuit patterns. In the photolithography processes, typically, pattern formation steps are repeated to constitute the layered structure of a semiconductor device in such a way that an upper-level pattern is overlaid to be aligned with a lower-level pattern. The lower-level pattern may be formed in, on, or over a semiconductor substrate.

The upper-level pattern needs to be aligned with the lower-level pattern at a specific alignment accuracy. To detect or measure the alignment or overlay error of the upper-level pattern with respect to the lower-level pattern, usually, alignment marks are additionally formed in, on, or over the semiconductor substrate.

FIGS. 1A to 1I show a conventional fabrication method of a semiconductor device, in which an alignment mark is used.

First, a first oxide layer 302 is formed on a main surface of a semiconductor substrate 301, as shown in FIG. 1A. The first oxide layer 302 serves as a first interlayer dielectric layer.

Next, a polysilicon layer 303 is grown on the first oxide layer 302. A patterned photoresist film 304 is formed on the polysilicon layer 303 thus formed by a photolithography process, as shown in FIG. 1B. Using the patterned photoresist film 304 as a mask, the underlying polysilicon layer 303 is then patterned to a specific shape by an etching process, forming a polysilicon wiring layer 305 on the first oxide layer 302. The photoresist film 304 is then removed. The state at this stage is shown in FIG. 1C.

Subsequently, a second oxide layer 306 is formed on the first oxide layer 302 to cover the polysilicon wiring layer 305, as shown in FIG. 1D. The second oxide layer 306 serves as a second interlayer dielectric layer.

A patterned photoresist film 307 is formed on the second oxide layer 306 by a photolithography process. As shown in FIG. 1E, this photoresist film 307 has windows 307A, 307B, and 307C uncovering the second oxide layer 306. Using the patterned photoresist film 307 as a mask, the first and second oxide layers 302 and 306 are selectively removed by an anisotropic etching process, forming a recess 308A and contact holes 308B and 308C. The photoresist film 307 is then removed. The state at this stage is shown in FIG. 1F.

The recess 308A, which is located at a corresponding position to the window 307A of the photoresist film 307, penetrates vertically the first and second oxide layers 302 and 306 to extend to the main surface of the substrate 301. The contact hole 308B, which is located at a corresponding position to the window 307B of the photoresist film 307, penetrates vertically the second oxide layer 306 only to extend to the underlying wiring layer 305. The contact hole 308C, which is located at a corresponding position to the window 307C of the photoresist film 307, penetrates vertically the first and second oxide layers 302 and 306 to extend to a region (not shown) formed in the main surface of the substrate 301.

The recess 308A has a square plan shape and is used for formation of an alignment mark. The contact hole 308B is used for electrical connection to the underlying polysilicon wiring layer 305. The contact hole 308C is used for electrical connection to the underlying region in the main surface of the substrate 301.

Further, an aluminum silicide (AlSi) layer 309 is formed on the patterned second oxide layer 306 to fill the contact holes 308B and 308C, as shown in FIG. 1G. The AlSi layer 309 is contacted with the polysilicon wiring layer 305 in the contact hole 308B and with the region in the main surface of the substrate 301 in the contact hole 308C. In the recess 308A, the AlSi layer 309 covers the bottom and side walls of the recess 308A. The recess 308A is not filled with the AlSi layer 309. A square recess 308D is formed on the AlSi layer 309 in the recess 308A.

Following this, a patterned photoresist film 310 is formed on the AlSi layer 309 by a photolithography process, as shown in FIG. 1H. To form an alignment mark 312A, a part 310A of the photoresist film 310 is located on the AlSi layer 309 in the recess 308D. The part 310A has a square plan shape smaller than that of the recess 308D.

The square-shaped part 310A of the photoresist film 310 left in the square-shaped recess 308A constitutes the alignment mark 312A. The relative position of the part 310A in the recess 308A indicates the alignment or overlay error of the patterned photoresist film 310 with respect to the patterned second oxide layer 306 (i.e., the contact holes 308A and 308B).

Specifically, as shown in FIG. 2, the alignment error of the patterned photoresist film 310 (i.e., the upper-level pattern) with respect to the patterned second oxide layer 306 (i.e., the lower-level pattern) is able to be known by measuring the distances X1, X2, Y1, and Y2 from the four sides of the part 310A of the photoresist film 310 to the corresponding opposite walls of the recess 308A of the second oxide layer 306. The measurement of the distances X1, X2, Y1, and Y2 is usually carried out using a proper measuring tool such as a Scanning Electron Microscope (SEM) and an optical microscope.

Subsequently, using the patterned photoresist film 310 as a mask, the underlying AlSi layer 309 is selectively removed by an anisotropic etching process, forming AlSi wiring lines 311B and 311C on the second oxide layer 306. The photoresist film 310 is then removed. The state at this stage is shown in FIG. 1I.

As seen from FIG. 1I, the wiring line 311B is contacted with and electrically connected to the polysilicon wiring layer 305 through the contact hole 308B. The wiring line 311C is contacted with and electrically connected to the region in the main surface of the substrate 301 through the contact hole 308C.

Because the part 310A of the photoresist film 310 exists in the recess 308D, as shown in FIG. 1H, a square-shaped part 309A of the AlSi layer 309 is left in the recess 308A, as shown in FIG. 1I. Therefore, the square-shaped part 309A of the AlSi layer 309 and the square-shaped recess 308A may be used as an alignment mark 312B.

The conventional fabrication method of a semiconductor device as described above has the following problem.

Specifically, the first and second oxide layers 302 and 306 are selectively removed during the anisotropic etching process for the recess 308A and the contact holes 308B and 308C. The main surface of the substrate 301 is uncovered in the recess 308A through this anisotropic etching process, as shown in FIG. 1F.

On the other hand, during the photolithography process for patterning the photoresist film 310 on the AlSi film 309 shown in FIG. 1H, the exposure light is set to be focused on the photoresist film 310 located on the second oxide layer 306. Further, the exposure light is set so that the part 310A of the photoresist film 310 located on the bottom of the recess 308D is included in a specific depth of focus of the exposure light.

However, in recent years, the total thickness of the first and second oxide layers 302 and 306 often becomes greater than the specific depth of focus of the exposure light. For example, a Metal-Oxide-Semiconductor field-effect transistor (MOSFET) is typically formed on the substrate 301 region, which is located below the polysilicon wiring lines 305. It is popular that the first oxide layer 302 has a thickness of 1 μm to 1.5 μm and that the contact holes 308B and 308C have a depth of approximately 0.6 μm.

In this case, the part 310A of the photoresist film 310 is very difficult to be included in the specific depth of focus of the exposure light, together with the remaining parts of the film 310 on the AlSi layer 309, resulting in an incorrect shape of the part 310A of the photoresist film 310. This incorrectness in shape leads to incorrect detection or measurement of the pattern misalignment.

SUMMARY OF THE INVENTION

Accordingly, an object of the present invention is to provide a formation method of an alignment mark that makes it possible to correctly measure the alignment error of patterns.

Another object of the present invention is to provide a fabrication method of a semiconductor device in which an upper-level pattern is overlaid to be aligned with a lower-level pattern at high alignment-accuracy.

The above objects together with others not specifically mentioned will become clear to those skilled in the art from the following description.

According to a first aspect of the present invention a formation method of an alignment mark is provided, which is comprised of the following steps (a) to (j).

(a) A first dielectric layer is formed on a surface of a semiconductor substructure.
(b) An etching resist part is formed on the first dielectric layer.
(c) A second dielectric layer is formed on the first dielectric layer to cover the etching resist part.
(d) A first lithography resist film is formed on the second dielectric layer.
(e) The first lithography resist film is patterned to have a window.
(f) The second dielectric layer is selectively etched to form a recess in the second dielectric layer using the first lithography resist film as a mask. The recess is located at a corresponding position to the window of the first lithography resist film. A bottom of the recess is defined by the etching resist part.
(g) The first lithography resist film is removed after the step (f).
(h) A layer to be patterned is formed on the second dielectric layer.
(i) A second lithography resist film is formed on the layer to be patterned.

(j) The second lithography resist film is patterned to have a specific shape in such a way that a part of the second lithography resist film is left in the recess of the second dielectric layer.

The part of the second lithography resist film left in the recess of the second dielectric layer serves as an alignment mark for measuring an alignment error of a pattern of the second lithography resist film with respect to a pattern of the second dielectric layer.

With the formation method of an alignment mark according to the first aspect of the present invention, after the etching resist part is formed between the first and second dielectric layers, the second dielectric layer is selectively etched to form the recess uncovering the etching stop using the first patterned lithography resist film as a mask. Therefore, the first dielectric layer is prevented from being etched in the recess of the second dielectric layer by the etching resist layer during the step (f) of selectively etching the second dielectric layer.

Accordingly, the part of the second lithography resist film left in the recess of the second dielectric layer has a height difference approximately equal to or less than the thickness of the second dielectric layer from another part of the second lithography resist film outside the recess. This means that both of these parts of the second lithography resist film may be included in a specific depth of focus of exposure light used in the step (j) of patterning the second lithography resist film.

As a result, the alignment error of the pattern of the second lithography resist film (or, the layer to be patterned) with respect to the pattern of the second dielectric layer can be measured correctly.

In a preferred embodiment of the formation method according to the first aspect of the present invention, the following steps (k) and (l) are additionally provided.

(k) The layer to be patterned is patterned to a specific shape corresponding to the shape of the second lithography resist film using the second lithography resist film as a mask. A part of the layer to be patterned is left on the etching stop in the recess of the second dielectric layer.
(l) The second lithography film is removed after the step (k).

The part of the layer to be patterned left in the recess of the second dielectric layer serves as an alignment mark for measuring an alignment error of a pattern of the layer to be patterned and a pattern of the second dielectric layer.

In the formation method according to the first aspect, when the etching stop has a single-layer structure, it is preferably made of one material selected from the group consisting of polysilicon, amorphous silicon, tungsten silicide (WSi), titanium silicide (TiSi), Molybdenum silicide (MoSi), Aluminum, an alloy (AlCu) of aluminum and copper, an alloy (AlSiCu) of aluminum silicide and copper, tungsten (W), titanium (Ti), titanium nitride (TiN), and an alloy (TiW) of titanium and tungsten.

When the etching stop has a multiple-layer structure consisting of conductive sublayers, each of the conductive sublayers is preferably made of one material selected from the same group as above.

According to a second aspect of the present invention, a fabrication method of a semiconductor device is provided, which is comprised of the following steps (a) to (k).

(a) A first dielectric layer is formed on a surface of a semiconductor substructure.
(b) A first conductive layer is formed on the first dielectric layer.
(c) The first conductive layer is patterned to form a wiring part and an etching resist part.

(d) A second dielectric layer is formed on the first dielectric layer to cover the wiring part and the etching resist part of the first conductive layer.

(e) A first lithography resist film is formed on the second dielectric layer.

(f) The first lithography resist film is patterned to have a fist window and a second window.

(g) The second dielectric layer is selectively etched to form a contact hole and a recess in the second dielectric layer using the first patterned lithography resist film as a mask. The contact hole uncovers the wiring part of the first conductive layer, and the recess uncovers the etching resist part thereof.

(h) The first lithography resist film is removed after the step (g).

(i) A second conductive layer is formed on the second dielectric layer having the contact hole and the recess to be contacted with the wiring part of the first conductive layer and the etching resist part thereof.

(j) A second lithography resist film is formed on the second conductive layer.

(k) The second lithography resist film is patterned to a specific shape in such a way that first and second parts of the second lithography resist film are left on the second conductive layer. The first part of the second lithography resist film is located outside the recess of the second dielectric layer. The second part of the second lithography resist film is located in the recess of the second dielectric layer.

The second part of the second lithography resist film left in the recess of the second dielectric layer serves as an alignment mark for measuring an alignment error of a pattern of the second lithography resist film with respect to a pattern of the second dielectric layer.

With the fabrication method of a semiconductor device according to the second aspect of the present invention, after the wiring and etching resist parts of the first conductive layer are formed between the first and second dielectric layers, the second dielectric layer is selectively etched to form the contact hole uncovering the wiring part of the first conductive layer and the recess uncovering the etching resist part of the first conductive layer in the second dielectric layer using the first patterned lithography resist film as a mask. Therefore, the first dielectric layer is prevented from being etched in the recess of the second dielectric layer by the etching resist part during the step (g) of selectively etching the second dielectric layer.

Accordingly, the second part of the second lithography resist film left in the recess of the second dielectric layer has a height difference approximately equal to or less than the thickness of the second dielectric layer from the first part of the second lithography resist film outside the recess. This means that both of the first and second parts of the second lithography resist film may be included in a specific depth of focus of exposure light used in the step (k) of patterning the second lithography resist film.

As a result, the alignment error of the pattern of the second lithography resist film (or, the second conductive layer) with respect to the pattern of the second dielectric layer can be measured correctly. This means that an upper-level pattern of a semiconductor device is overlaid to be aligned with a lower-level pattern thereof at high alignment-accuracy.

In a preferred embodiment of the fabrication method according to the second aspect of the present invention, the following steps (l) and (m) are additionally provided.

(l) The second conductive layer is patterned to a specific shape corresponding to the shape of the second lithography resist film using the second patterned lithography resist film as a mask. A part of the second conductive layer is left on the etching resist part of the first conductive layer in the recess of the second dielectric layer.

(m) The second patterned lithography resist film is removed after the step (l).

The part of the second conductive layer left in the recess of the second dielectric layer serves as an alignment mark for measuring an alignment error of a pattern of the second conductive layer and a pattern of the second dielectric layer.

In the fabrication method according to the second aspect, when the first conductive layer has a single-layer structure, it is preferably made of one material selected from the group consisting of polysilicon, amorphous silicon, tungsten silicide (WSi), titanium silicide (TiSi), Molybdenum silicide (MoSi), Aluminum, an alloy (AlCu) of aluminum and copper, an alloy (AlSiCu) of aluminum silicide and copper, tungsten (W), titanium (Ti), titanium nitride (TiN), and an alloy (TiW) of titanium and tungsten.

When the first conductive layer has a multiple-layer structure consisting of conductive sublayers, each of the conductive sublayers is preferably made of one material selected from the same group as above.

In the methods according to the first and second aspects of the present invention, the semiconductor substructure is simply made of a semiconductor substrate. However, the semiconductor substructure may be made of the combination of a semiconductor substrate and at least one conductive or dielectric layer formed on the surface of the substrate. In this case, the surface of the substructure is formed by a top-level surface of the at least one conductive or dielectric layer.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
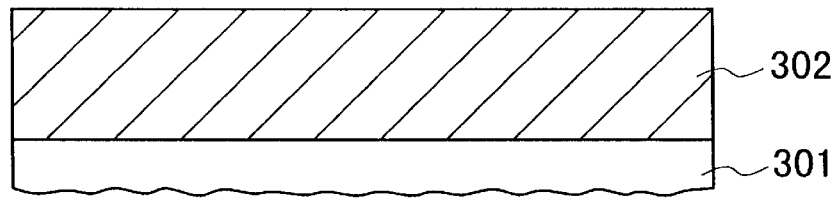
FIGS. 1A to 1I are partial cross-sectional views showing a conventional formation method of an alignment mark, respectively.
Figure 1B:
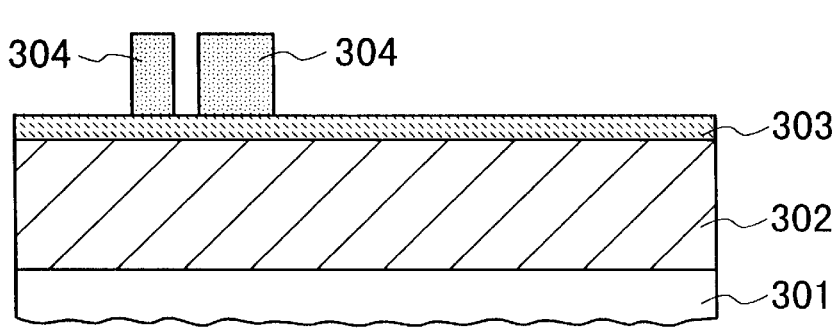
Figure 1C:
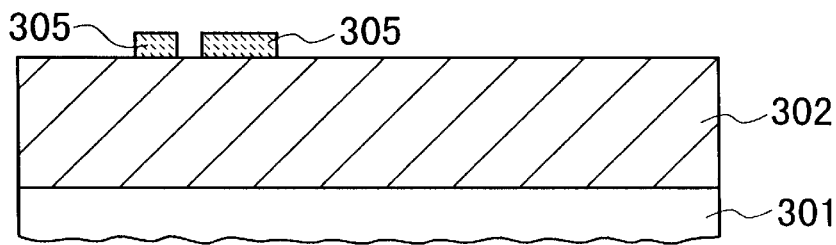
Figure 1D:
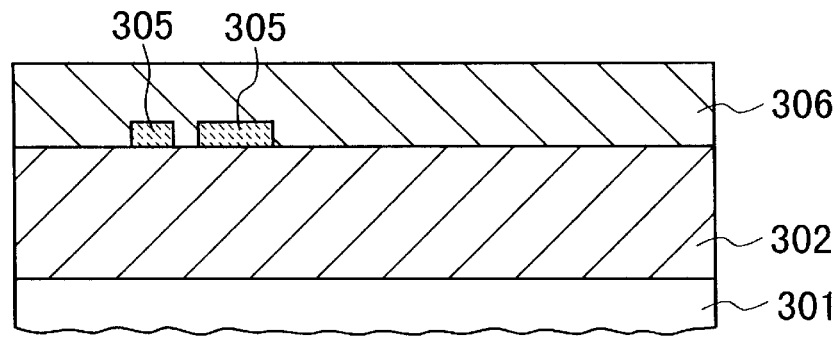
Figure 1E:
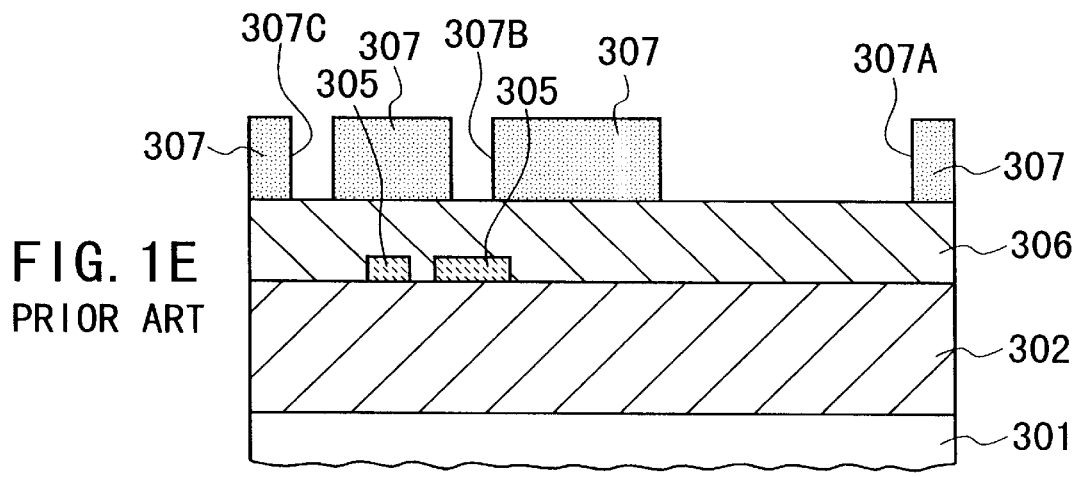
Figure 1F:
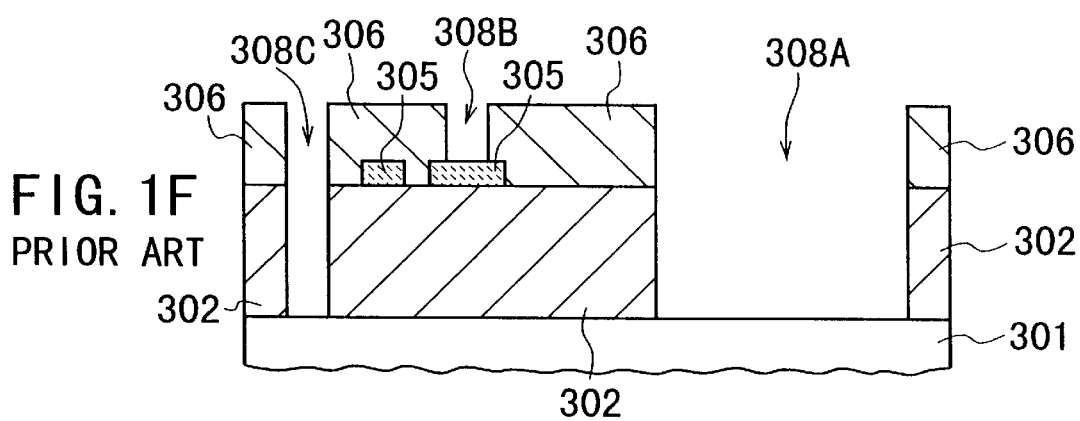
Figure 1G:
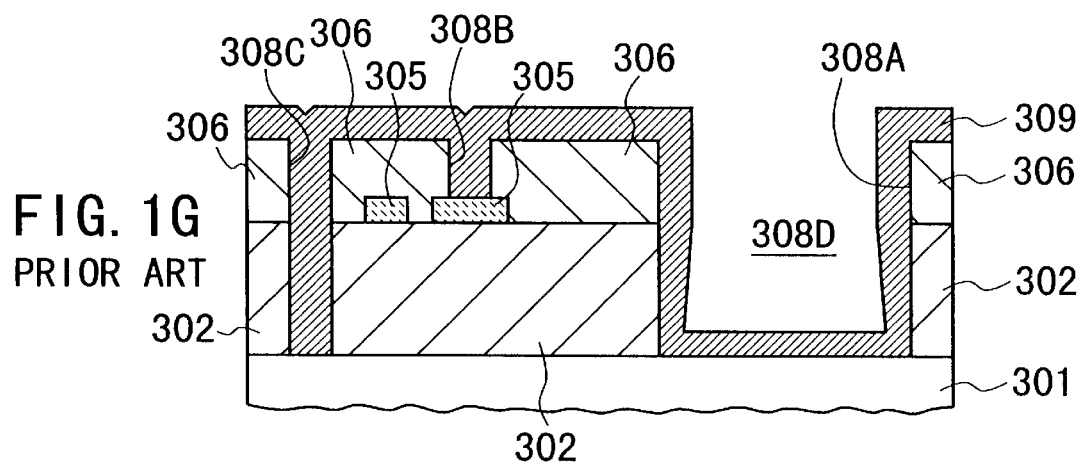
Figure 1H:
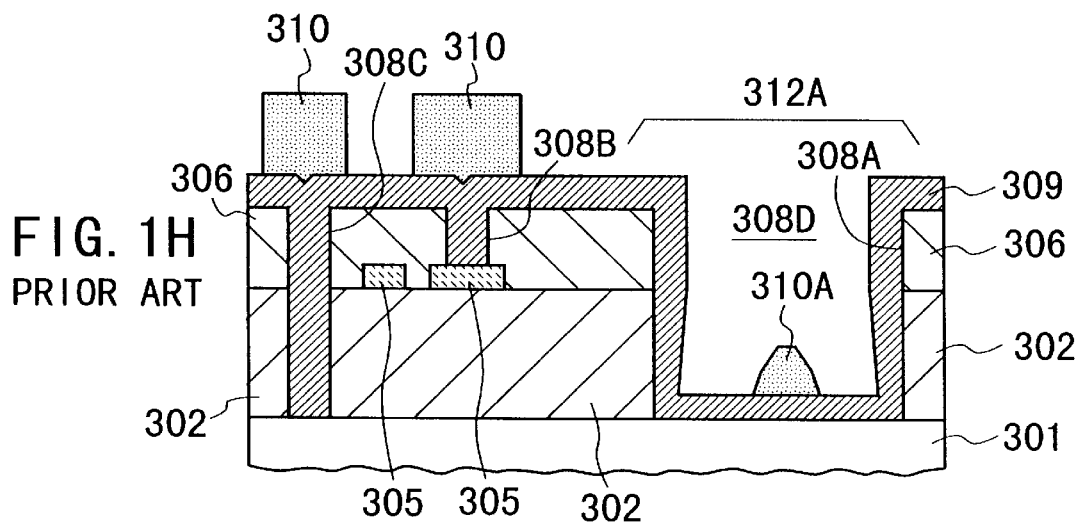
Figure 1I:
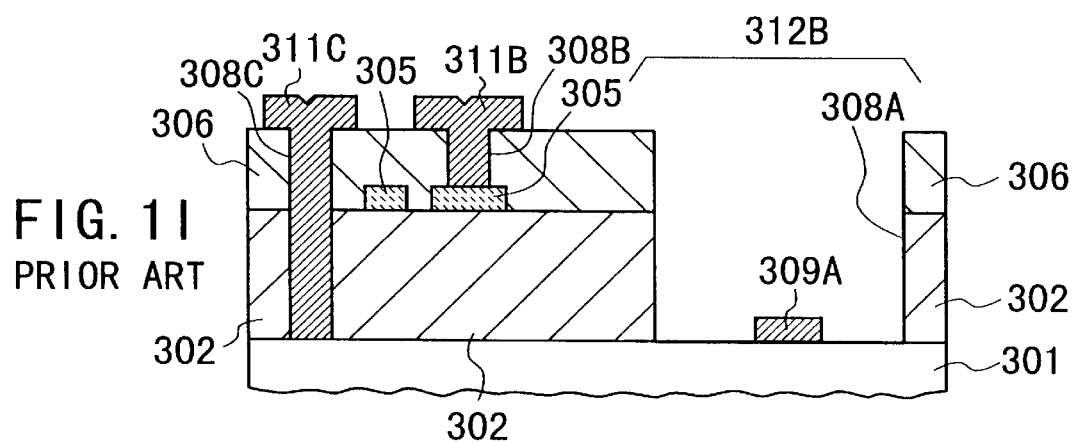
Figure 2:
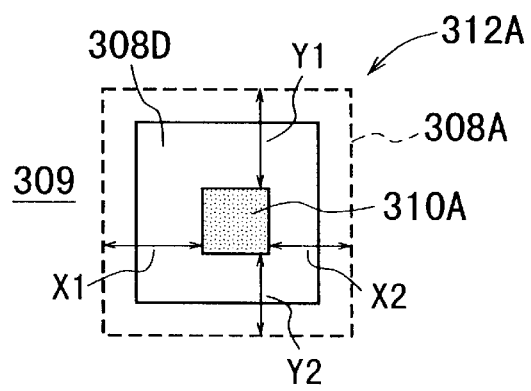
FIG. 2 is a schematic plan view of the conventional alignment mark fabricated by the conventional method shown in FIGS. 1A to 1I.

Preferred embodiments of the present invention will be described below referring to the drawings attached.

FIRST EMBODIMENT

Figure 3A:
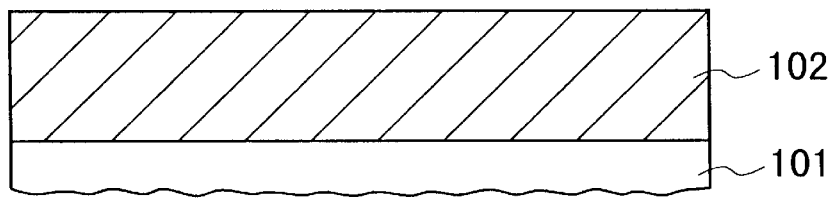
FIGS. 3A to 3I are partial cross-sectional views showing a fabrication method of a semiconductor device according to a first embodiment of the present invention, respectively.

In a fabrication method of a semiconductor device according to a first embodiment of the invention, first, a semiconductor substrate or wafer 101 is prepared, as shown in FIG. 3A.

Although a lot of semiconductor chips are formed on this substrate or wafer 101, only one of the chips is shown in this specification and attached drawings for the sake of simplification of description.

Figure 3B:
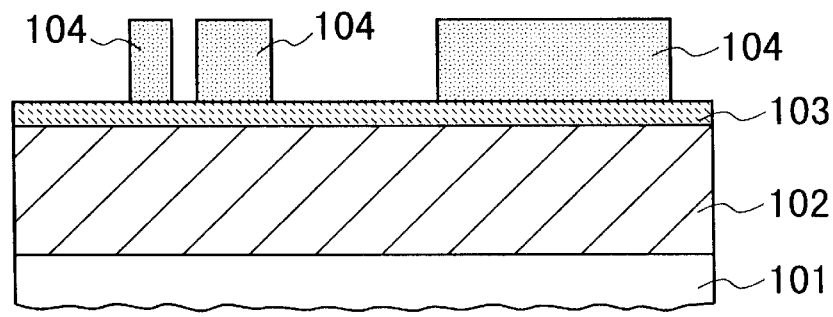

Next, a first oxide layer 102 serving as a first interlayer dielectric layer is formed on a main surface of a semiconductor substrate 101, as shown in FIG. 3A. A polysilicon layer 103 is grown on the first oxide layer 102 and then, a photoresist film 104 is formed on the polysilicon layer 103 and is patterned to a specific shape by a photolithography process. The state at this stage is shown in FIG. 3B.

Figure 3C:
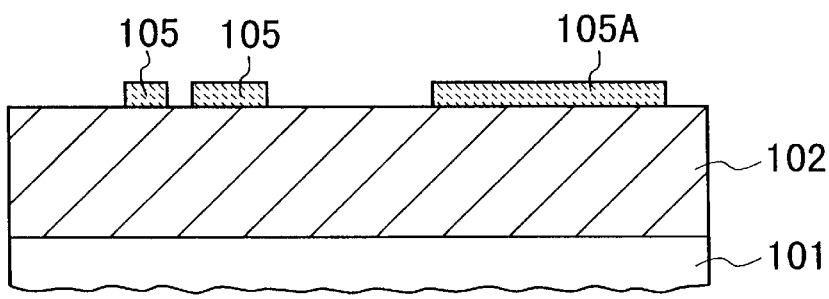

Then, using the patterned photoresist film 104 as a mask, the underlying polysilicon layer 103 is patterned to a specific shape by an etching process, forming polysilicon wiring parts 105 on the first oxide layer 102. Unlike the above-described conventional method, an etching stop part 105A is formed on the first oxide layer 102 by the patterned polysilicon layer 103 during this etching process, as shown in FIG. 3C. The etching stop part 105A is located in the area where an alignment mark is to be formed.

Figure 3D:
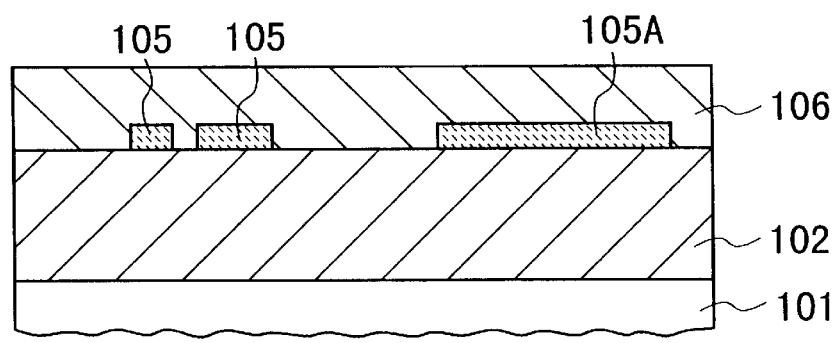
Figure 3E:
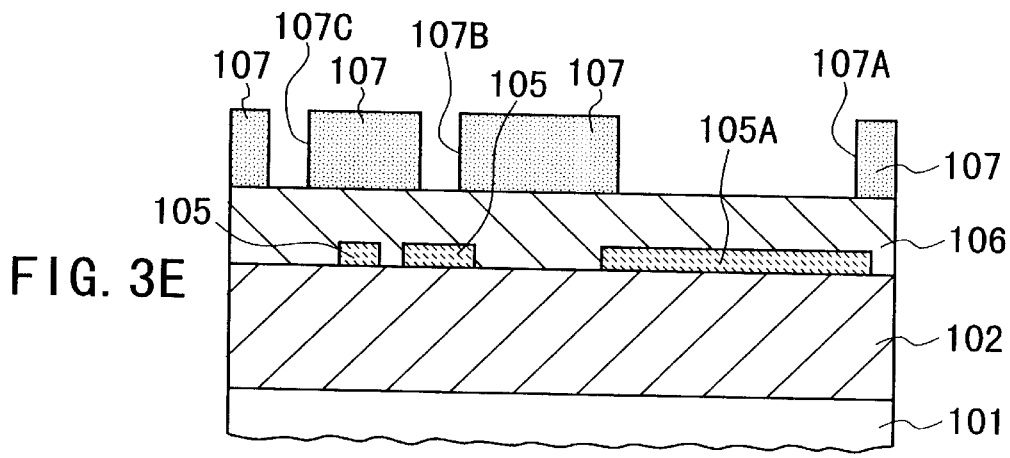

Subsequently, a second oxide layer 106 serving as a second interlayer dielectric layer is formed on the first oxide layer 102 to cover the wiring parts 105 and etching stop part 105A, as shown in FIG. 3D. A photoresist film 107 is formed on the second oxide layer 106 and is patterned to a specific shape by a photolithography process, as shown in FIG. 3E. This photoresist film 107 has windows 107A, 107B, and 107C uncovering the second oxide layer 106.

For example, the wiring parts 105 serve as word lines, digit lines, or wiring lines for plate electrodes in a Dynamic Random Access Memory (DRAM).

Figure 3F:
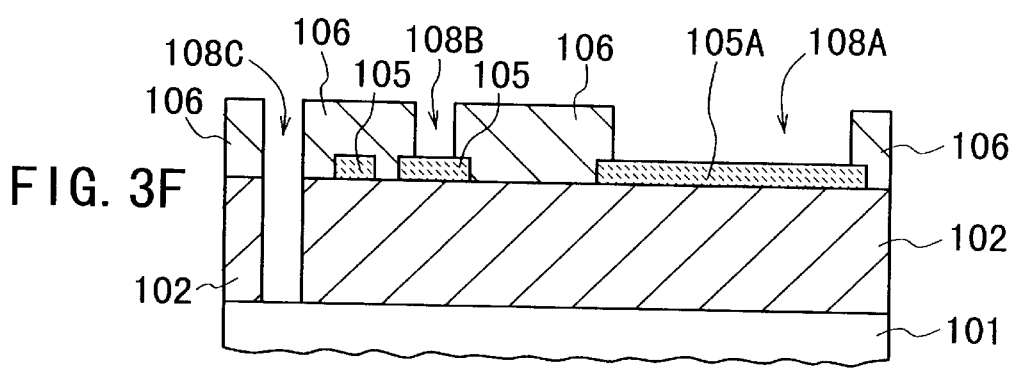

Using the patterned photoresist film 107 as a mask, the first and second oxide layers 102 and 106 are selectively removed by an anisotropic etching process, forming a recess 108A and contact holes 108B and 108C, as shown in FIG. 3F. The recess 108A is used for formation of an alignment mark. The recess 108A, which corresponds to the square-shaped window 107A of the photoresist film 107, penetrates vertically the second oxide layer 106 to extend to the etching stop part 105A on the first oxide layer 102. The contact hole 108B, which corresponds to the window 107B of the photoresist film 107, penetrates vertically the second oxide layer 106 to extend to a corresponding one of the wiring parts 105. The contact hole 108C, which corresponds to the window 108C of the photoresist film 107, penetrates vertically the first and second oxide layers 102 and 106 to extend to a diffusion region 101A formed in the main surface of the substrate 101.

The recess 108A has a square plan shape and is used for formation of an alignment mark. The contact hole 108B is used for electrical connection to the underlying polysilicon wiring part 105. The contact hole 308C is used for electrical connection to the underlying region 101A in the main surface of the substrate 101.

Figure 3G:
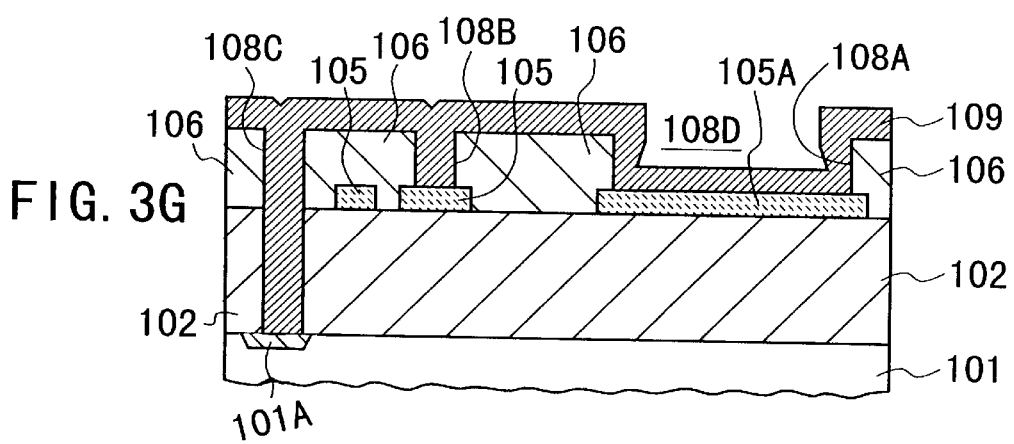

Further, an aluminum silicide (AlSi) layer 109 is formed on the patterned second oxide layer 106 to fill the contact holes 108B and 108C, as shown in FIG. 3G. The AlSi layer 109 is contacted with the polysilicon wiring part 105 in the contact hole 108B and with the diffusion region 101A in the main surface of the substrate 101 in the contact hole 108C. In the recess 108A, the AlSi layer 109 covers the bottom and side walls of the recess 108A. The recess 108A is not filled with the AlSi layer 109. A square recess 108D is formed on the AlSi layer 109 in the recess 108A.

Figure 3H:
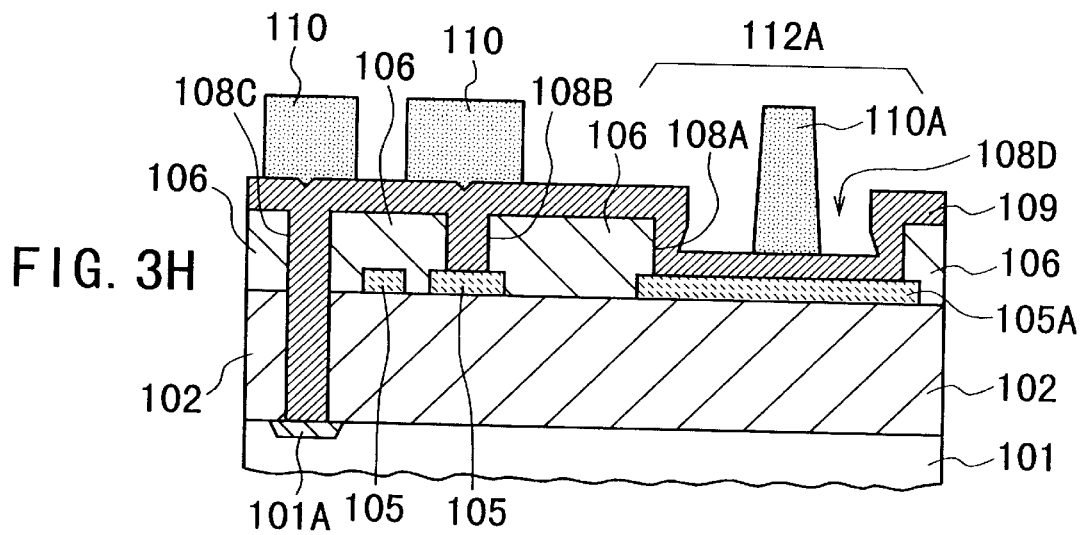

Following this, a photoresist film 110 is formed on the AlSi layer 109 and is patterned to a specific shape by a photolithography process, as shown in FIG. 3H. Because the recess 108D is formed on the AlSi layer 109 in the recess 108A, a part 110A of the photoresist film 110 is left on the AlSi layer 109 in the recess 108D. The part 110A has a square plan shape smaller than that of the recess 108D.

The square-shaped part 110A of the photoresist film 110 left in the square-shaped recess 108A constitutes an alignment mark 112A. The relative position of the part 110A in the recess 108A indicates the alignment or overlay error of the patterned photoresist film 110 with respect to the patterned second oxide layer 106 (i.e., the contact holes 108B and 108C).

Figure 4:
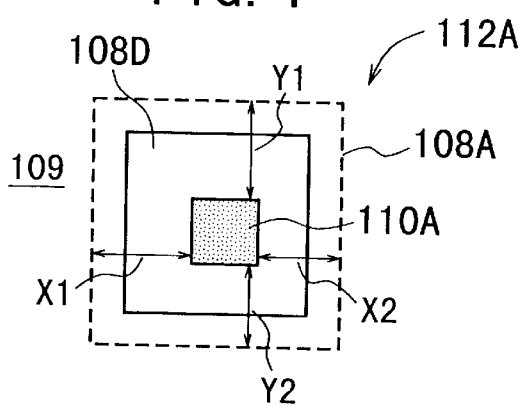
FIG. 4 is a schematic plan view of an alignment mark formed in the method according to the first embodiment.

Specifically, as shown in FIG. 4, the alignment error of the patterned photoresist film 110 (i.e., the upper-level pattern) with respect tot the patterned second oxide layer 106 (i.e., the lower-level pattern) is able to be known by measuring the distances X1, X2, Y1, and Y2 from the four sides of the part 110A of the photoresist film 110 to the corresponding opposite walls of the recess 108A of the second oxide layer 106.

The measurement of the distances X1, X2, Y1, and Y2 is carried out using a proper measuring tool such as a SEM and an optical microscope.

Subsequently, using the patterned photoresist film 110 as a mask, the underlying AlSi layer 109 is selectively removed by an anisotropic etching process, forming AlSi wiring lines 111B and 111C on the second oxide layer 106. The photoresist film 110 is then removed. The state at this stage is shown in FIG. 3I.

Figure 3I:
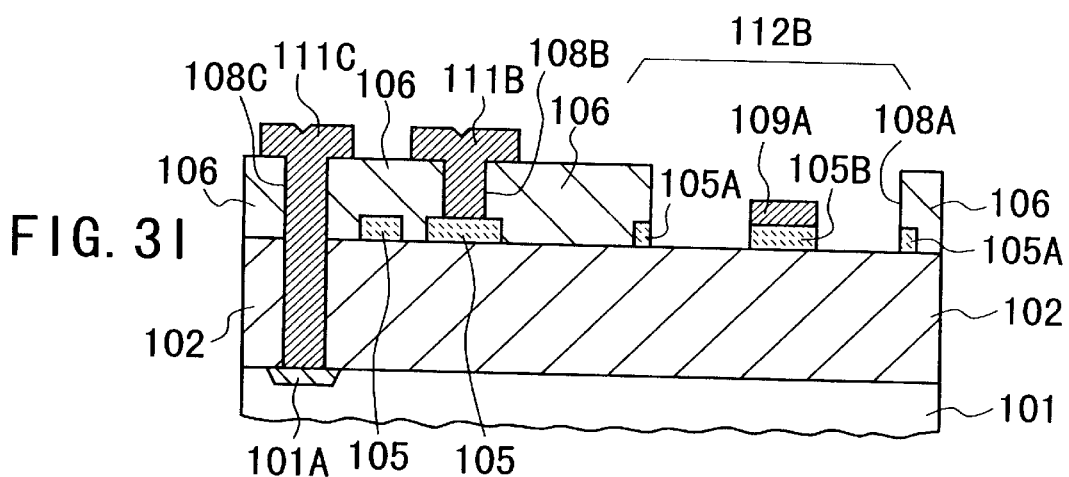

As seen from FIG. 3I, the wiring line 111B is contacted with and electrically connected to the polysilicon wiring part 105 through the contact hole 108B. The wiring line 111C is contacted with and electrically connected to the diffusion region 101A in the main surface of the substrate 101 through the contact hole 108C.

Because the part 110A of the photoresist film 110 exists in the recess 308E, as shown in FIG. 3H, a square-shaped part 109A of the AlSi layer 109 is left in the recess 108A, as shown in FIG. 3I. Therefore, the square-shaped part 109A of the AlSi layer 109 located in the square-shaped recess 108A may be used as an alignment mark 112B.

The relative position of the part 109A in the recess 108A indicates the alignment or overlay error of the wiring lines 111B and 111C with respect to the contact holes 108B and 108C.

Thus, the semiconductor device is completed.

With the fabrication method of a semiconductor device according to the first embodiment, after the wiring parts 105 and the etching resist part 105A is formed between the first and second oxide layers 102 and 106 by patterning the polysilicon layer 103, the second oxide layer 106 is selectively etched to form the contact holes 108B and 108C uncovering the wiring parts 105 and the recess 108A uncovering the etching resist part 105A in the first and second oxide layers 102 and 106 using the patterned photoresist film 107 as a mask. Therefore, the first oxide layer 102 is prevented from being etched in the recess 108A of the second oxide layer 106 by the etching resist part 105A during the step of selectively etching the second oxide layer 106 (refer to FIG. 3F).

Accordingly, the part 110A of the patterned photoresist film 110 left in the recess 108A of the second oxide layer 106 has a height difference less than the thickness of the second oxide layer 106 from the remaining parts of the photoresist film 110 outside the recess 108A. This means that both of the parts of the photoresist film 110 may be included in a specific depth of focus of exposure light used in the step of patterning the photoresist film 110.

As a result, the alignment error of the pattern of the photoresist film 110 (or, the AlSi layer 109) with respect to the pattern of the second oxide layer 106 can be measured correctly. This means that an upper-level pattern of a semiconductor device is overlaid to be aligned with a lower-level pattern thereof at high alignment-accuracy.

SECOND EMBODIMENT

Figure 5A:
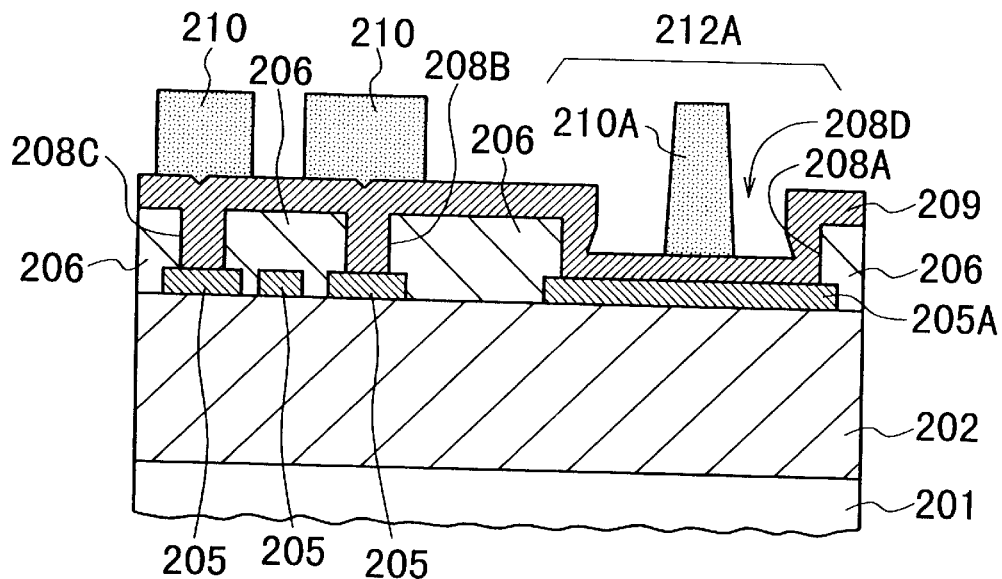
FIGS. 5A and 5B are partial cross-sectional views showing a fabrication method of a semiconductor device according to a second embodiment of the present invention, respectively.
Figure 5B:
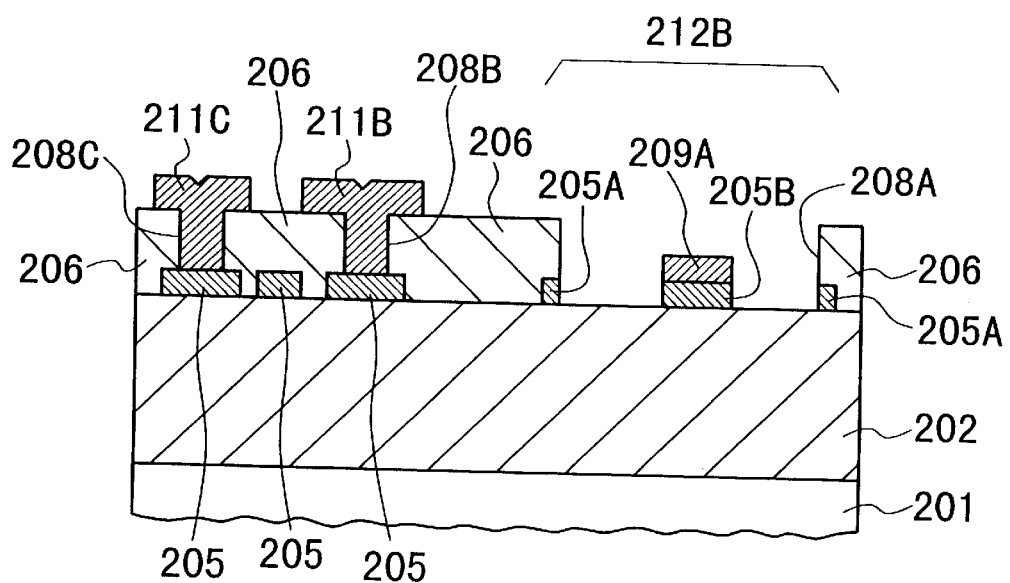

FIGS. 5A and 5B show a fabrication method of a semiconductor device according to a second embodiment of the invention. FIGS. 5A and 5B correspond to FIGS. 3H and 3I in the first embodiment, respectively. The process steps prior to the step of FIG. 5A are substantially the same as those in the first embodiment shown in FIGS. 3A to 3G.

Specifically, a first oxide layer 202 serving as a first interlayer dielectric layer is formed on a main surface of a semiconductor substrate 201. An aluminum silicide (AlSi) layer (not shown) is grown on the first oxide layer 202 and then, a photoresist film (not shown) is formed on the AlSi layer and is patterned to a specific shape by a photolithography process.

Then, using the patterned photoresist film as a mask, the underlying AlSi layer is patterned to a specific shape by an etching process, forming polysilicon wiring parts 205 on the first oxide layer 202, as shown in FIG. 5A. Similar to the method according to the first embodiment, an etching stop part 205A is formed on the first oxide layer 202 by the patterned AlSi layer during this etching process. The etching stop part 205A is located in the area where an alignment mark is to be formed.

Subsequently, a second oxide layer 206 serving as a second interlayer dielectric layer is formed on the first oxide layer 202 to cover the wiring parts 205 and etching stop part 205A, as shown in FIG. 5A. A photoresist film (not shown) is formed on the second oxide layer 206 and is patterned to a specific shape by a photolithography process. This photoresist film has windows uncovering the second oxide layer 206.

Using the patterned photoresist film as a mask, the first and second oxide layers 202 and 206 are selectively removed by an anisotropic etching process, forming a recess 208A and contact holes 208B and 208C, as shown in FIG. 5A. The recess 208A is used for formation of an alignment mark. The recess 208A penetrates vertically the second oxide layer 206 to extend to the etching stop part 205A on the first oxide layer 202. The contact hole 208B penetrates vertically the second oxide layer 106 to extend to a corresponding one of the wiring parts 205. The contact hole 208C penetrates vertically the second oxide layer 106 to extend to a corresponding one of the wiring parts 205.

The recess 208A has a square plan shape and is used for formation of an alignment mark. The contact holes 208B and 208C are used for electrical connection to the underlying polysilicon wiring parts 205, respectively.

Further, an AlSi layer 209 is formed on the patterned second oxide layer 206 to fill the contact holes 208B and 208C, as shown in FIG. 5A. The AlSi layer 209 is contacted with the corresponding polysilicon wiring parts 205 in the contact holes 208B and 208C, respectively. In the recess 208A, the AlSi layer 209 covers the bottom and side walls of the recess 208A. The recess 208A is not filled with the AlSi layer 209. A square recess 208D is formed on the AlSi layer 209 in the recess 208A.

A photoresist film 210 is formed on the AlSi layer 209 and is patterned to a specific shape by a photolithography process, as shown in FIG. 5A. Because the recess 208D is formed on the AlSi layer 209 in the recess 208A, a part 210A of the photoresist film 210 is left on the AlSi layer 209 in the recess 208D. The part 210A has a square plan shape smaller than that of the recess 208D.

The square-shaped part 210A of the photoresist film 210 left in the square-shaped recess 208A constitutes an alignment mark 212A. The relative position of the part 210A in the recess 208A indicates the alignment or overlay error of the patterned photoresist film 210 with respect to the patterned second oxide layer 206 (i.e., the contact holes 208B and 208C).

Subsequently, using the patterned photoresist film 210 as a mask, the underlying AlSi layer 209 is selectively removed by an anisotropic etching process, forming AlSi wiring lines 211B and 211C on the second oxide layer 206. The photoresist film 210 is then removed. The state at this stage is shown in FIG. 5B.

As seen from FIG. 5B, the wiring line 211B is contacted with and electrically connected to the corresponding one of the AlSi wiring parts 205 through the contact hole 208B. The wiring line 211C is contacted with and electrically connected to the corresponding one of the AlSi wiring parts 205 through the contact hole 208C.

Because the part 210A of the photoresist film 210 exists in the recess 208E, as shown in FIG. 5A, a square-shaped part 209A of the AlSi layer 209 is left in the recess 208A, as shown in FIG. 5B. Therefore, the square-shaped part 209A of the AlSi layer 209 located in the square-shaped recess 208A may be used as an alignment mark 212B.

The relative position of the part 209A in the recess 208A indicates the alignment or overlay error of the wiring lines 211B and 211C with respect to the contact holes 208B and 208C.

Thus, the semiconductor device is completed.

It is obvious that the fabrication method of a semiconductor device according to the second embodiment has the same advantages as those in the first embodiment.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A formation method of an alignment mark, comprising the steps of:
   (a) forming a first dielectric layer on a surface of a semiconductor substructure;
   (b) forming an etching resist part on said first dielectric layer;
   (c) forming a second dielectric layer on said first dielectric layer to cover said etching resist part;
   (d) forming a first lithography resist film on said second dielectric layer;
   (e) patterning said first lithography resist film to have a window;
   (f) selectively etching said second dielectric layer to form a recess in said second dielectric layer using said first lithography resist film as a mask;
   said recess being located at a corresponding position to said window of said first lithography resist film;
   a bottom of said recess being defined by said etching resist part;
   (g) removing said first lithography resist film after the step (f);

(h) forming a layer to be patterned on said second dielectric layer;

(i) forming a second lithography resist film on said layer to be patterned; and (j) patterning said second lithography resist film to have a specific shape in such a way that a part of said second lithography resist film is left in said recess of said second dielectric layer;

wherein said part of said second lithography resist film left in said recess of said second dielectric layer serves as an alignment mark for measuring an alignment error of a pattern of said second lithography resist film with respect to a pattern of said second dielectric layer.

2. A method as claimed in claim 1, further comprising the steps of:

(k) patterning said layer to be patterned to a specific shape corresponding to the shape of said second lithography resist film using said second lithography resist film as a mask;

a part of said layer to be patterned being left on said etching resist in said recess of said second dielectric layer; and (l) removing said second lithography film after the step (k);

wherein said part of said layer to be patterned left in said recess of said second dielectric layer serves as an alignment mark for measuring an alignment error of a pattern of said layer to be patterned and a pattern of said second dielectric layer.

3. A method as claimed in claim 1, wherein said etching resist part is made of at least one material selected from the group consisting of polysilicon, amorphous silicon, tungsten silicide (WSi), titanium silicide (TiSi), Molybdenum silicide (MoSi), Aluminum, an alloy (AlCu) of aluminum and copper, an alloy (AlSiCu) of aluminum silicide and copper, tungsten (W), titanium (Ti), titanium nitride (TiN), and an alloy (TiW) of titanium and tungsten.

4. A fabrication method of a semiconductor device, comprising the steps of:

(a) forming a first dielectric layer on a surface of a semiconductor substructure;

(b) forming a first conductive layer on said first dielectric layer;

(c) patterning said first conductive layer to form a wiring part and an etching resist part;

(d) forming a second dielectric layer on said first dielectric layer to cover said wiring part and said etching resist part of said first conductive layer;

(e) forming a first lithography resist film on said second dielectric layer;

(f) patterning said first lithography resist film to have a fist window and a second window;

(g) selectively etching said second dielectric layer to form a contact hole and a recess in said second dielectric layer using said first patterned lithography resist film as a mask; said contact hole uncovering said wiring part of said first conductive layer, and said recess uncovering said etching resist part thereof;

(h) removing said first lithography resist film after the step (g);

(i) forming a second conductive layer on said second dielectric layer having said contact hole and said recess to be contacted with said wiring part of said first conductive layer and said etching resist part thereof;

(j) forming a second lithography resist film on said second conductive layer; and (k) patterning said second lithography resist film to a specific shape in such a way that first and second parts of said second lithography resist film are left on said second conductive layer;

said first part of said second lithography resist film being located outside said recess of said second dielectric layer;

said second part of said second lithography resist film being located in said recess of said second dielectric layer;

wherein said second part of said second lithography resist film left in said recess of said second dielectric layer serves as an alignment mark for measuring an alignment error of a pattern of said second lithography resist film with respect to a patter of said second dielectric layer.

5. A method as claimed in claim 4, further comprising the steps of:

(l) patterning said second conductive layer to a specific shape corresponding to the shape of said second lithography resist film using said second patterned lithography resist film as a mask;

a part of said second conductive layer being left on said etching resist part of said first conductive layer in said recess of said second dielectric layer; and (m) removing said second patterned lithography resist film after the step (l);

wherein said part of said second conductive layer left in said recess of said second dielectric layer serves as an alignment mark for measuring an alignment error of a pattern of said second conductive layer and a pattern of said second dielectric layer.

6. A method as claimed in claim 4, wherein said etching resist part of said first conductive layer is made of at least one material selected from the group consisting of polysilicon, amorphous silicon, tungsten silicide (WSi), titanium silicide (TiSi), Molybdenum silice (MoSi), Aluminum, an alloy (AlCu) of aluminum and copper, an alloy (AlSiCu) of aluminum silicide and copper, tungsten (W), titanium (Ti), titanium nitride (TiN), and an alloy (TiW) of titanium and tungsten.

\* \* \* \* \*